United States Patent [19]
Kimura et al.

[11] Patent Number: 6,077,140
[45] Date of Patent: Jun. 20, 2000

[54] SCREEN MANUFACTURING METHOD USING FLAT DISPLAY PANELS AND RADIATION MECHANISM OF FLAT DISPLAY PANELS

[75] Inventors: Kazuo Kimura; Kazuhisa Hemmi; Kazumasa Ogura, all of Tokyo, Japan

[73] Assignee: Mitsubishi Denki Kabushiki Kaisha, Tokyo, Japan

[21] Appl. No.: 09/263,629

[22] Filed: Mar. 5, 1999

[30] Foreign Application Priority Data

Sep. 30, 1998  [JP]  Japan .................................. 10-277152

[51] Int. Cl.[7] ...................................................... H01J 9/24
[52] U.S. Cl. .............................................................. 445/24
[58] Field of Search .................................. 445/24; 348/383

[56] References Cited

U.S. PATENT DOCUMENTS

5,523,790  6/1996  Kalua ........................................ 348/383

*Primary Examiner*—Kenneth J. Ramsey
*Attorney, Agent, or Firm*—Rothwell, Figg, Ernst & Manbeck

[57] ABSTRACT

In this screen manufacturing method, a method of effectively cooling flat display panels (1) which form a display screen is provided. A mechanism for cooling the flat display panels (1) is also provided. More specifically, in this manufacturing method, when a display screen (50) is assembled, clearances (41) are provided between modules (40) in which the flat display panels (1) are lined up to, thereby facilitate air circulation driven by a fan (42). Further, a radiation member is fitted to a holder which fixes the flat display panels (1). Thus, a surface area of the holder becomes larger by a portion equivalent to the radiation member, whereby radiative cooling is enhanced.

5 Claims, 9 Drawing Sheets

SCREEN MANUFACTURING METHOD USING FLAT DISPLAY PANELS AND RADIATION MECHANISM OF FLAT DISPLAY PANELS

BACKGROUND OF THE INVENTION

1. Field of the Invention

The present invention relates to an arrangement and a radiation mechanism of flat display panels for cooling the flat display panels during the process of manufacturing a display screen using such flat display panels.

2. Description of the Related Art

Heretofore, there has been a method of using a plasma display as a display member for manufacturing a large display screen with a size of 254 centimeters to several meters. This plasma display is characterized in that a single display board of a relatively large size can be formed. Display is performed by applying voltage from both sides of the display board. However, as the display board becomes larger, an image quality at the center of the screen will deteriorate due to resistance of an electrode line of the display board.

Thus, if a display screen is formed by longitudinally and latitudinally arranging a plurality of flat display panels which are small in size, but can be driven independently, it will be possible to easily manufacture a large screen of more than dozens of meters without causing troubles, such as that of a plasma display.

When voltage is applied to electrodes, an electric discharge occurs inside a display cell of a flat display panel, thereby leading to display of the flat display panel. Thus, due to discharge action which simultaneously takes place in a large number of flat display panels, if display continues, the surface temperature of a display screen will greatly rise. Therefore, cooling is carried out by providing fans or the like to the display screen.

However, in a display screen assembled by closely lining up flat display panels, the amount of heat released from the large number of flat display panels can overwhelm the cooling ability of the installed fans, and surface temperatures of the display screens sometimes exceed 100° C. Such temperatures can shorten the life of the flat display panel and deteriorate the screen display quality.

SUMMARY OF THE INVENTION

The present invention was made in order to solve the problems described above. The object of the present invention is to provide a screen manufacturing method using flat display panels and a radiation mechanism of the flat display panels which can effectively cool the flat display panels that form a display screen.

In order to achieve the object described above, the screen manufacturing method using flat display panels according to the present invention is such that, in a screen manufacturing method of producing a display screen by lining up a plurality of flat display panels each of which can independently be driven and perform display using a display section provided on its surface in response to an application of voltage to electrode pins installed on its back surface, the flat display panels are arranged leaving a clearance barely large enough to permit air circulation between the flat display panels.

In a further aspect, when a module is formed by putting the plurality of flat display panels together and a display screen is formed by lining up modules, the modules are arranged leaving a clearance to barely permit air to circulate between the modules.

Further, a radiation mechanism of flat display panels according to the present invention is characterized in that, when a display screen is formed by fixing on a panel fixture flat display panels each of which can independently be driven and perform display using a display section provided on its surface in response to an application of voltage to electrode pins installed on its back surface and by fixing the panel fixture, a radiation member is provided on a back surface side of the panel fixture.

The radiation member described above may be a fin.

Further, the panel fixture may be molded by a magnesium alloy.

According to the present invention, since modules, each of which is formed by a single flat display panel or a plurality of flat display panels arranged leaving a clearance to barely permit an air circulation between the modules, it is possible to improve radiation effect of the flat display panels as compared with an arrangement of the modules leaving no clearance between the modules. Further, when, for example, fan is provided, circulation of air is facilitated by the clearance. Thus, a spontaneous cooling effect of the flat display panels can be further improved.

Further, by fitting a radiation member to a panel fixture, a surface area can be made larger, thereby increasing a cooling effect of the radiation.

Further, a panel fixture may be molded of a magnesium alloy. Thus, as compared with a case in which ordinary aluminum is used, the panel fixture can have a higher rigidity and be lighter in weight.

DESCRIPTION OF THE PREFERRED EMBODIMENTS

Preferred embodiments of the present invention will be described below with reference to the accompanying drawings.

First Embodiment

Figure 1:
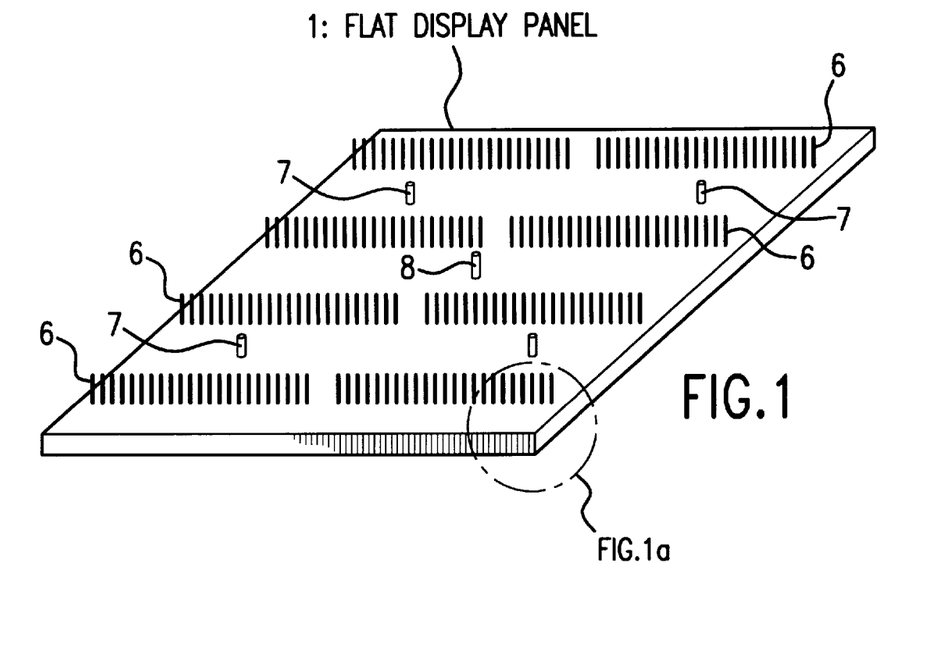
FIG. 1 is a block diagram showing an embodiment of flat display panels used for producing a display screen according to the present invention.
Figure 1A:
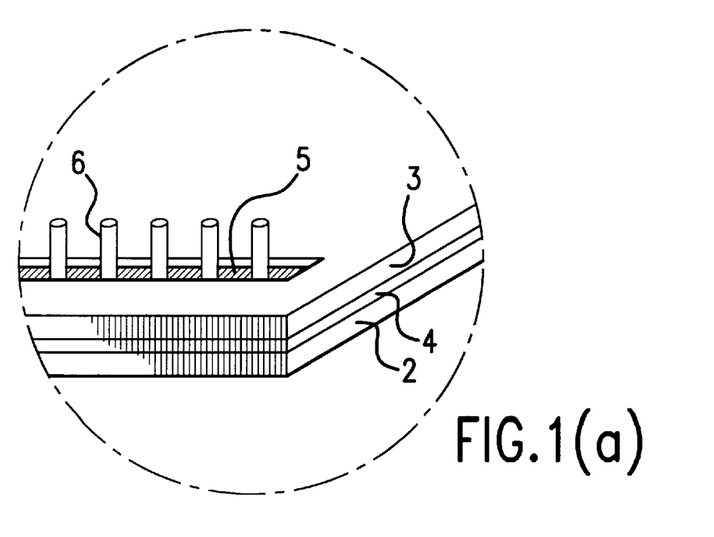

FIG. 1 is a block diagram showing a first embodiment of flat display panels used for manufacturing a display screen by a screen manufacturing method according to the present invention. In this embodiment, for example, flat display panels 1 manufactured by a method which is disclosed in an international patent application (application number: PCT/JP98/01444) filed by the applicant of the present invention according to the Patent Cooperation Treaty are used. In the flat display panels 1, a transparent front glass substrate 2 at which a pair of electrodes are provided and a back glass substrate 3 at which a discharging space of a display cell is formed by providing a concave electrode at a position opposite to the electrodes, and a sealed layer 4 is formed by applying frit seal between the substrates. On a back surface of the flat display panel 1, lead pins 6 and 7 are installed in a standing position on individual electrodes and on common electrodes via an electrode takeoff window 5 of the back glass substrate 3. An exhaust glass tube 8 required at the time of producing the flat display panels 1 is installed nearly at the center of the back surface of the flat display panels 1.

In flat display panels 1 having such constitution, in response to an application of voltage to any one of the lead pins 6 and 7, electric discharge takes place in a corresponding display cell and a fluorescent substance is emitted, thereby displaying an image. In such a manner, the flat display panels can individually be driven, while heat is emitted when an electric discharge is performed in the display cell. If display is continued, the surface temperature of the flat display panels will become high.

When a large number of flat display panels are individually installed, the assembly of the display screen becomes troublesome as it becomes difficult to line up the entire display screen evenly. Thus, in this embodiment, a module is formed in which the flat display panels 1 are arranged longitudinally and latitudinally by m×n, and a display screen is manufactured by assembling modules. By manufacturing each module in accordance with a process which will be described later, it is possible to eliminate deviation to a three dimensional direction between flat display panels arranged by m×n. A manufacturing method will subsequently be described. In this embodiment, to ease understanding, a module of "m=n=2" will be described as an example. Of course, it is obvious that the invention is not limited to the size.

In this embodiment, during a process of manufacturing a display screen, m (=2) flat display panels 1 and corresponding flexible substrates are fixed on a holder so as to form a unit, a frame is fitted to the unit and a connector for electrically connecting to the flat display panels 1 external equipment for driving the flat display panels 1 is fixed to form a submodule. Next, n (=2) submodules are connected to form a module. The process of forming the unit by fixing the two flat display panels 1 and the corresponding flexible substrates on the holder will next be described for an example where the direction of lining up the flat display panels 1 on the holder 10 is the transverse direction of the screen and the direction of connecting submodules is the longitudinal direction.

Figure 2A:
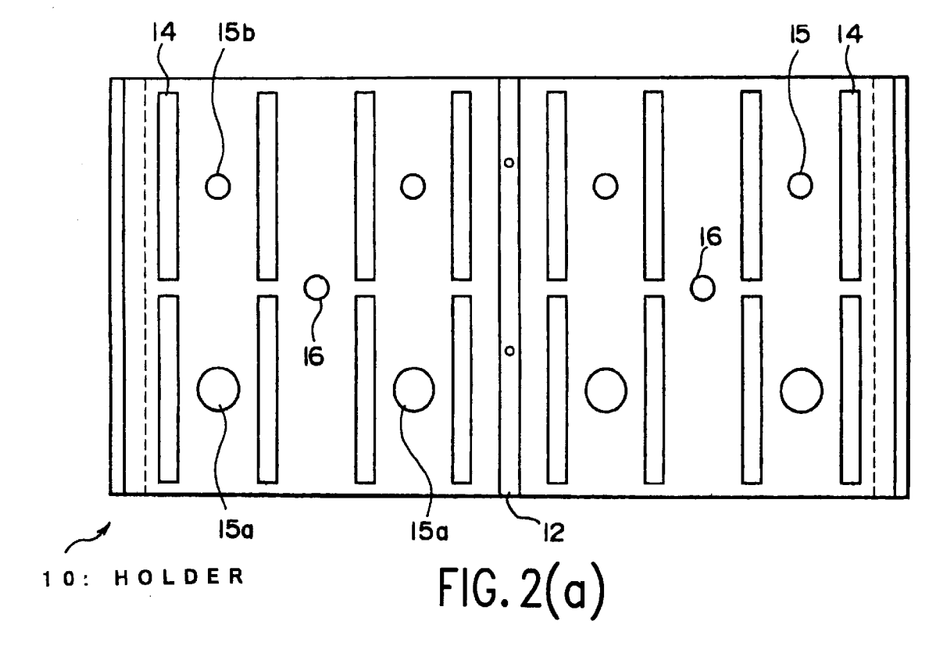
FIG. 2 shows the constitution of a holder according to a first embodiment of the present invention.
Figure 2B:
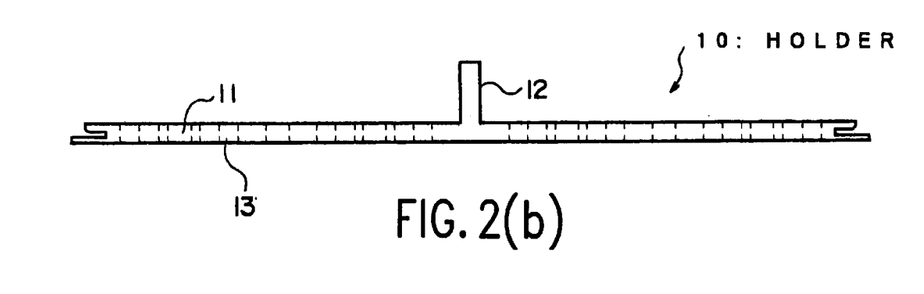

Two flat display panels 1 are fixed on the holder 10 one at a time. FIG. 2(a) is a plan view of a back surface of the holder 10 provided as a panel fixture according to the embodiment. This view is from the opposite side of a fitting surface of the flat display panels 1. FIG. 2(b) is a side view of the holder 10. The holder 10 is composed of a plate type substrate 11 on which the flat display panels 1 are fixed and a plate 12 which is installed at near the center of the substrate 11 in a standing position so that a frame is fixed to the holder 10 with a clearance being secured between the frame described later and the substrate 11. At the substrate 11, there are provided holes (openings) 14, 15, and 16 which are included to allow lead pins for individual electrodes (hereinafter referred to as individual electrode pins) 6 and lead pins for common electrodes (hereinafter referred to as common electrode pins) 7 installed in a standing position on the flat display panels 1 to be attached to surface 13 of the holder 10 and to allow a path for the exhaust glass tube 8.

Figure 3:
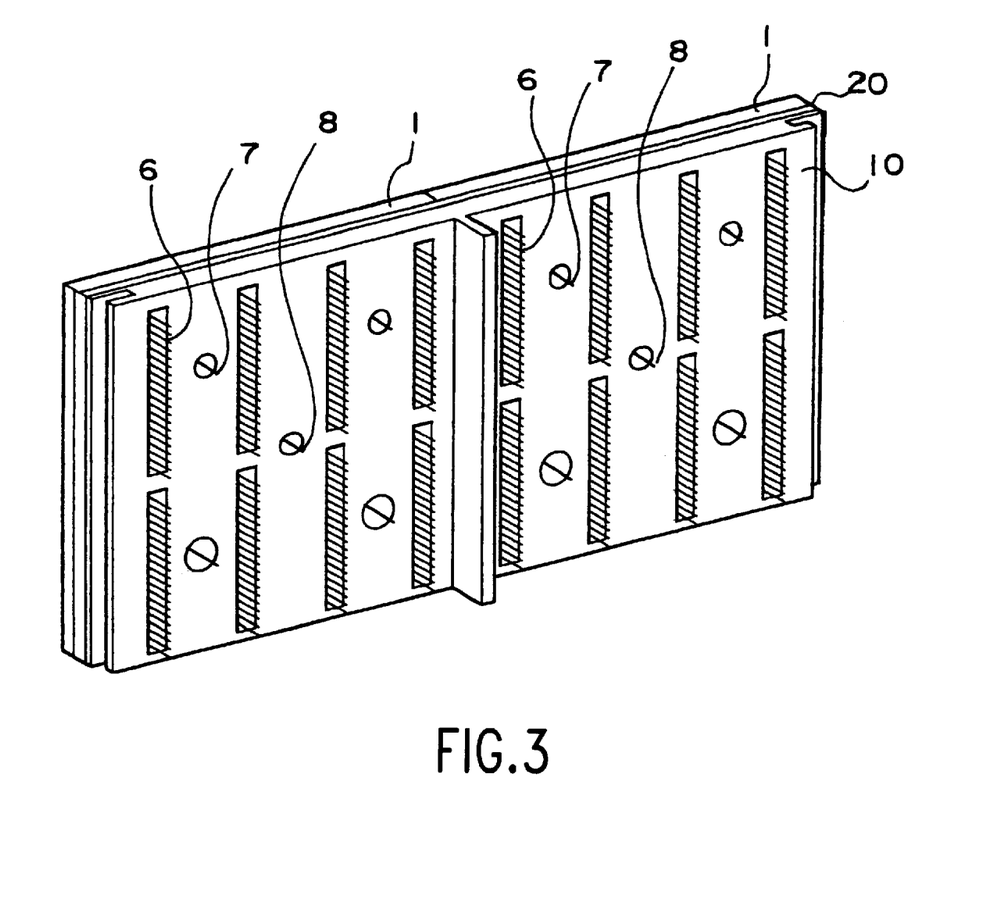
FIG. 3 shows overall constitution after two flat display panels are attached to the holder of the first embodiment.

In this embodiment, a duplex tape 20 (see FIG. 3) of similar size to the substrate 11 is used as a member for fixing the flat display panels 1 on the holder 10. The duplex tape 20 has a uniform thickness, and similar openings are provided at positions of the duplex tape 20 corresponding to the through holes 14, 15, and 16 of the substrate 11. After the duplex tape 20 is installed in the holder 10, the flat display panels 1 are attached thereto. However, since the size of the holes 14 and 15 is set to be larger than the diameter of the lead pins 6 and 7, the position of the flat display panels is likely to deviate from the prescribed position in a direction revolving around the central exhaust glass tube 8. The prescribed attachment position is the position where all of the flat display panels 1 to be fixed on the holder 10 aligned in parallel. Thus, in the present invention deviation in as described above is prevented by providing jigs, marks, or the like. FIG. 3 shows overall constitution after the two flat display panels 1 are installed in the holder 10.

Figure 4:
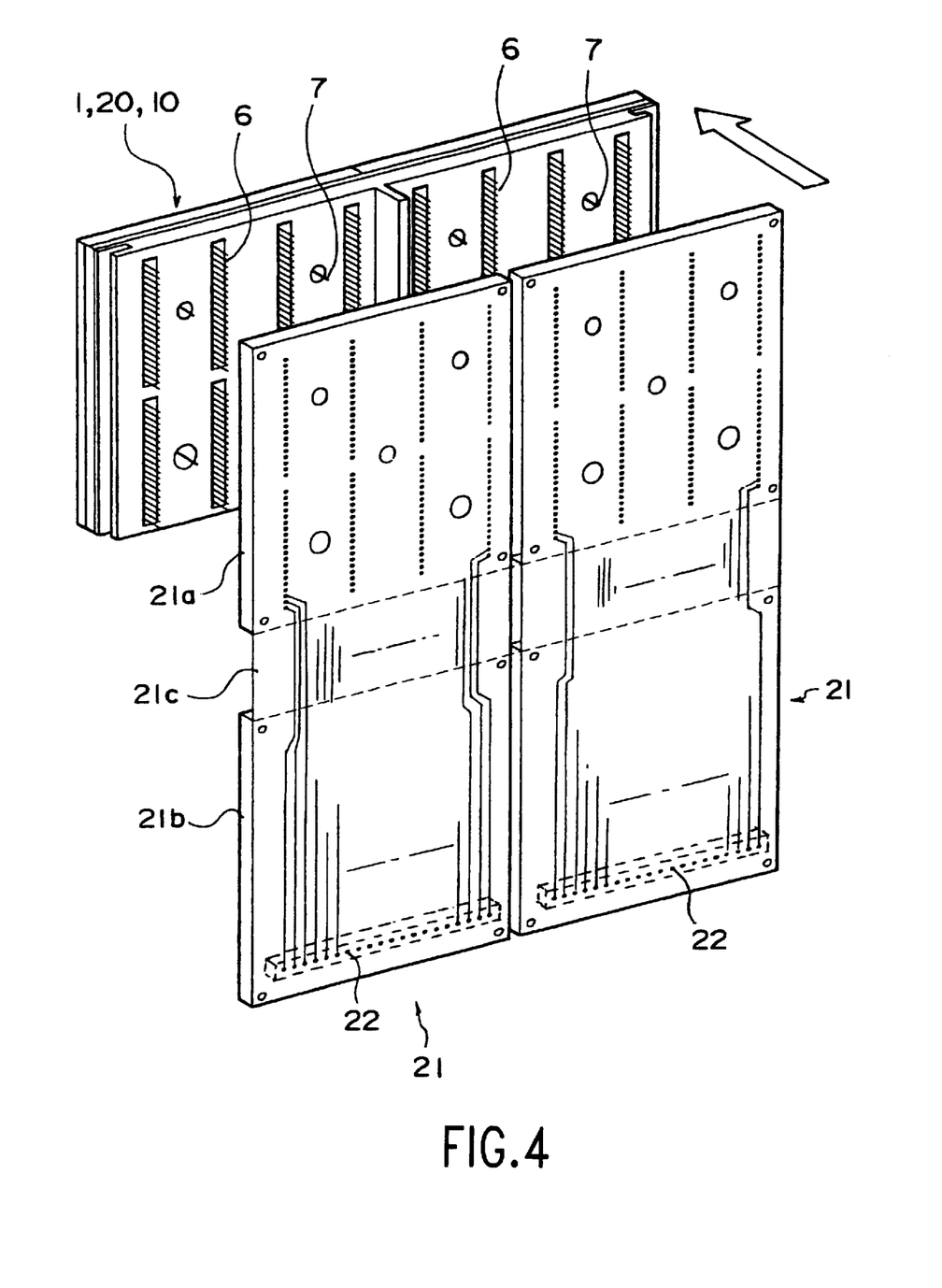
FIG. 4 is an explanatory view showing a process of fitting a flexible substrate on the flat display panels from a back side of the holder of the first embodiment.

Next, as shown in FIG. 4, a flexible substrate 21 is fitted to the flat display panel 1 from the back surface side of the holder 10. A method of fitting the flexible substrate 21 will be described, as will its constitution.

The flexible substrate 21 is a print substrate causing a fluorescent substance in the flat display panel 1 to emit light by supplying to the flat display panel 1 the voltage applied from external equipment. In this embodiment, the flexible substrate 21 is composed of a substrate section 21a which connects lead pins 6 and 7 of the flat display panel 1, a substrate section 21b for connecting the flat display panel 1 to outside, and a bent section 21c which electrically connects each of the substrate sections 21a and 21b. Bent section 21C is bent at the time of forming a submodule, as will be described in more detail later. Each of the substrate sections 21a and 21b is half the size of the holder 10, i.e., about the size of the flat display panel 1. Holes are provided at the positions of the substrate section 21a which correspond to lead pins 6 and 7. The lead pins 6 and 7 are installed in a standing position at the positions corresponding to the holes by insertion into the holes before the four corners of the substrate section 21a is screwed to the holder 10. The lead pins 6 and 7 which project from the holes are then soldered to the substrate section 21a. In such a manner, the flexible substrate 21 is fixed on the flat display panel 1.

Further, a connector 22 electrically connecting the flat display panel 1 to external equipment is fixed on the substrate section 21b. A large number of holes, including tapped holes, are provided at the positions of the substrate section 21b which correspond to the positions where connector 22 is fixed, and a large number of pins fitted to the connector 22 are inserted into these respective holes. The connector 22 is screwed into place, and the pins projecting from the holes are soldered. Thus, each of the lead pins 6 and 7 and each of the pins of the connector 22 are electrically connected. In other words, electrodes of the flat display panel 1 are extended to the connector 22 and collected at one place. In this embodiment, as two flat display panels 1 are attached to the holder 10, a number of flexible substrates 21 equivalent to the number of flat display panels 1 are installed.

In the manner described above, after a unit is formed by attaching two pieces of flat display panels 1 and corresponding flexible substrates 21 on the holder 10, a submodule is formed by fitting a frame to the holder 10 which constitutes the unit.

Figure 5A:
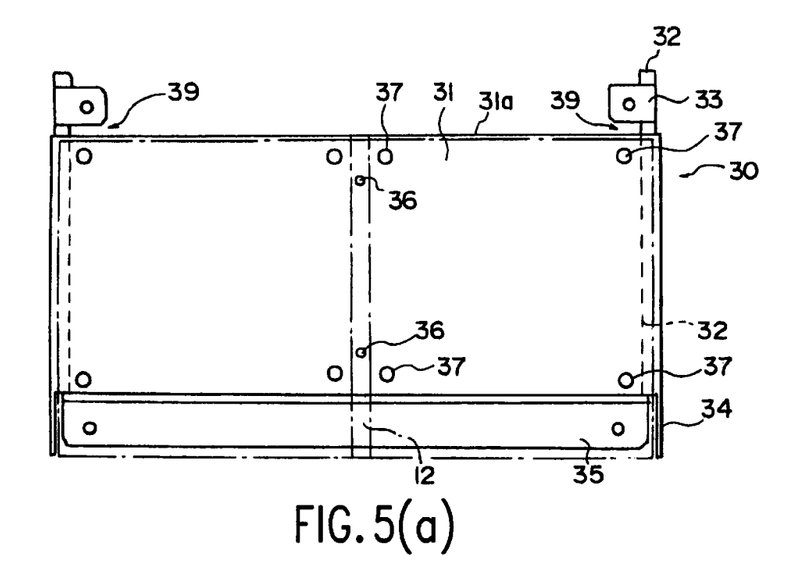
FIG. 5 shows the constitution of a frame used in a panel according to the first embodiment.
Figure 5B:
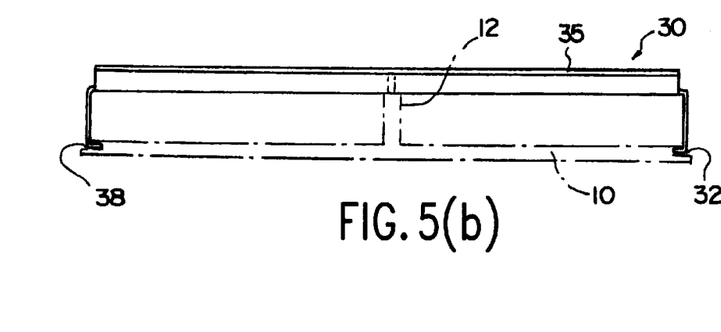
Figure 5C:
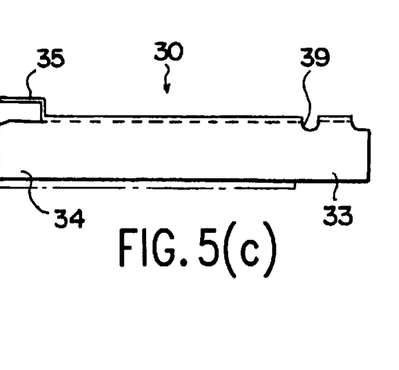

FIG. 5 shows the constitution of a frame used in this embodiment. In FIG. 5, the holder 10 is shown by dashed lines to illustrate the connection of a frame 30 and the holder 10. Before the frame 30 is fitted, as described above, the flat display panel 1 and the flexible substrate 21 are fixed on the holder 10, although this is not indicated in the drawing.

The frame 30 has a plate type body 31 with a width which is almost the same as that of the holder 10. Both ends of the frame 30 are bent by the height of the plate 12 and the tips are further bent so that a bent section 32 is formed. A connection member 33 for forming a module by the connection with another holder 10 is provided at an extended portion of one side which forms a width of the frame 30. The extended portion is extended in a direction of upper part of FIG. 5(a) [the right in FIG. 5(c)]. The bent section 32 is extended up to the connection member 33. A guide plate 34 which guides the connection member 33 of another frame 30 connected with the holder 10 is installed near the corner of the frame 30 which is situated on the lower part of FIG. 5(a) [the left in FIG. 5(c)] and also on one side forming a width of the frame 30. On one side of the body 31 and also on the lower part of FIG. 5(a) [the left in FIG. 5(c)], an assembly plate 35 is formed in a bent position to facilitate fitting of screws or pins which are used for fixing the frame 30 to a display or the like. Further, on a center line where the body 31 is in contact with the plate 12, tapped holes 36 for screwing the plate 12 are provided. Tapped holes 37 for fixing the substrate section 21b are also provided. The frame 30 has a configuration of line symmetry around the center line described above.

By fitting the bent section 32 of the frame 30 having the configuration described above in junction grooves 38 formed at both ends of the holder 10, the frame 30 is fixed on the holder 10. At this time, as shown in FIG. 5, the frame 30 is installed at such a position that the holder 10 is settled between a line, which links a tip of each guide plate 34, and an upper side 31a of the body 31.

Figure 6:
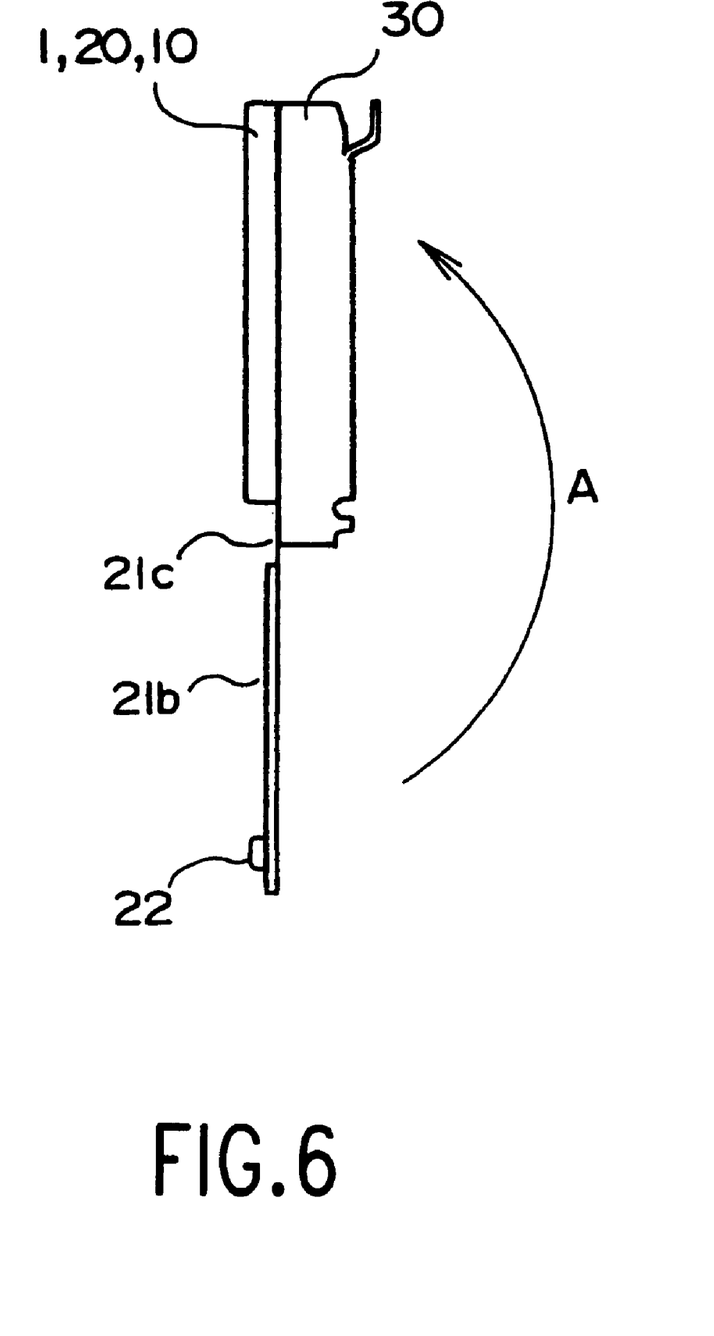
FIG. 6 shows a condition immediately after the frame is fitted to a unit according to the first embodiment.

After the frame 30 is installed, the substrate section 21b of the flexible substrate 21 is in a state that it projects from a cage formed by the frame 30 and the holder 10 as shown in FIG. 6. In this embodiment, the substrate section 21b is lifted up in a direction indicated by an arrow A and fitted to a surface of the frame 30. At this time, as is clear from FIG. 5(a), there is a clearance between each connection member 33 of the frame 30 and therefore the bent section 21c of the flexible substrate 21 can be guided to a clearance 39 between the connection member 33 and the body 31. The substrate section 21b is then screwed on the frame 30 at its four corners.

Figure 7:
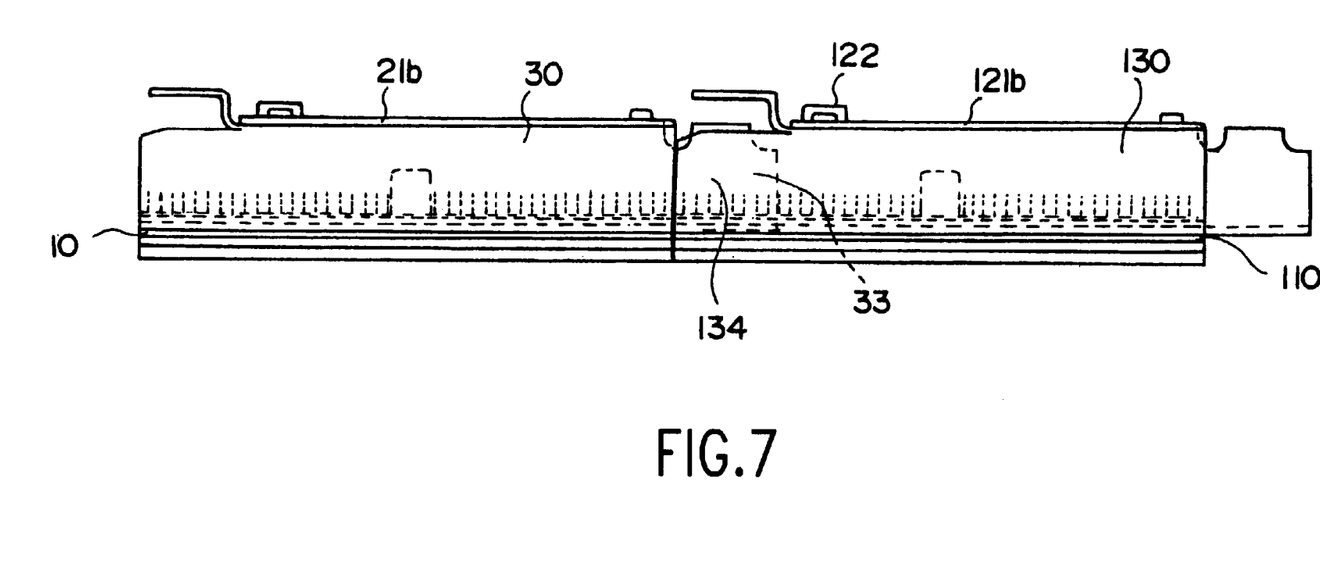
FIG. 7 is a side view of a module formed by connecting submodules according to the first embodiment.

A submodule is formed by fitting the frame 30 on the holder 10 which constitutes a unit as described above, and then, by connecting submodules, a module is formed. FIG. 7 is a side view showing a module formed by connecting two submodules. In FIG. 7, numeral 100 is added to a numeral attached to each member of another submodule which is connected by the connection member 33 of one submodule. The side on which the connection member 33 of the two submodules formed is arranged is opposite the side on which a guide plate 134 is arranged. While the connection member 33 is inserted into another guide plate 134, the bent section 32 of the connection member 33 is inserted in junction grooves of another holder 110. In such a manner, two submodules are connected in a longitudinal direction of the screen so as to form a module.

In this example, as described above, a module is formed by a total of four flat display panels, made up of each two flat display panels for two submodules (2×2). However, it may also be preferable to form the module using an other method.

By lining up modules longitudinally and latitudinally, a display screen can be easily manufactured. This embodiment is characterized in that modules are arranged leaving a minimal clearance to permit an air circulation between the modules. Thus, as compared with an arrangement of the modules with no clearance between them, heat radiation of each flat display panel 1 is facilitated. Further, if a fan is provided, circulation of air from the fan will be facilitated due to the clearance. Therefore, the cooling effect of the flat display panels 1 is enhanced.

Figure 8:
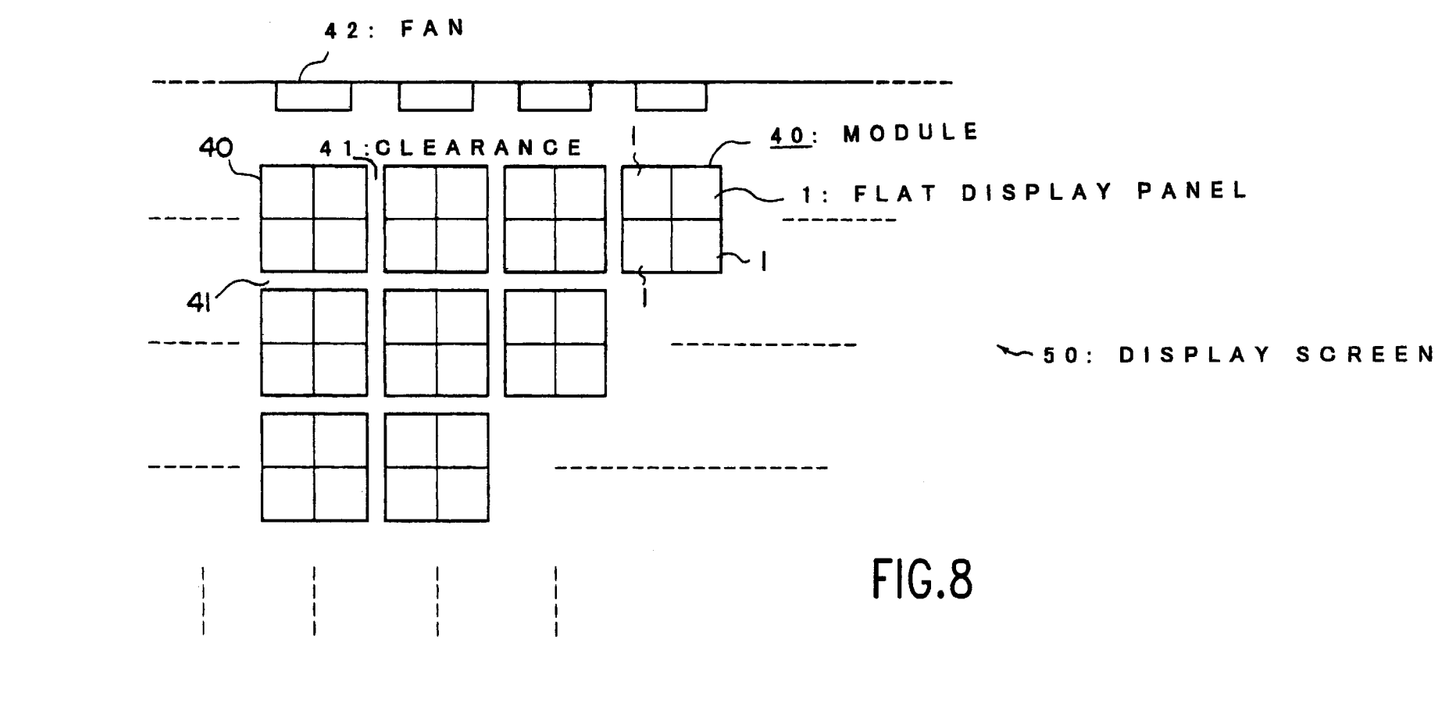
FIG. 8 is a schematic block diagram showing the main part of a display screen manufactured according to the first embodiment.

FIG. 8 is a schematic block diagram showing the main part of a display screen manufactured according to this embodiment. When a display screen 50 is manufactured, as shown in FIG. 8, nodules 40 are assembled with clearances 41 provided longitudinally and latitudinally between each of the modules 40. Clearances between the modules are determined by prepositioned pins or the like. In this embodiment, if the clearance is, for example, approximately 0.5 mm, this is enough clearance to enable a visual inspection of a deviation (lean) of the fitted modules 40, and does not greatly influence the quality of the image. However, the amount of clearance may be determined in consideration of other factors, such as quantity of heat release of the flat display panels, size of the screen, and environment where the display screen 50 is to be installed. As described above, two sides of each flat display panel 1 are left open due because of the provided clearances 41, and heat radiation is enhanced as compared with a case where the flat display panel I is surrounded on all directions by other flat display panels.

In this embodiment, a fan 42 is fitted to an upper part of the display screen 50 in order to allow air to flow downward. Thus, cooling can be performed from a back surface side of each module 40. Further, an opening is provided in a vertical direction of the screen between a holder and a frame which constitute the module 40. Therefore, it is possible to effectively cool the flat display panels 1 from the opening. Particularly in this embodiment, air can be circulated through clearances 41 provided between the modules 40, whereby an effect of cooling the flat display panels 1 can be further enhanced.

It may also be preferable that the display screen be entirely airtight and that a cooling medium be used. However, a constitution in which clearances 41 are provided between the modules 40 so as to facilitate air circulation can easily bring about a spontaneous cooling effect.

In consideration of manufacturing efficiency or assembly tolerance of the display screen 50, the flat display panels 1 may be modularized as described above. However, it may also be preferable to manufacture the display screen 50 by assembling the flat display panels 1 one at a time without modularization. In such a case, each of the flat display panels 1 are arranged such that clearances are provided on all sides, or such that a clearance is provided on at least one side.

It is also possible to arrange the plasma displays of a screen is manufactured using a plurality of plasma displays so that a clearance is left between the displays and thereby obtain an effect similar to that described above. However, because the flat display panel 1 measures approximately 10×10 centimeters square, considerably more effective cooling can be obtained by arranging of the display panels with a clearance between them than is possible with plasma displays.

Second Embodiment

Figure 9A:
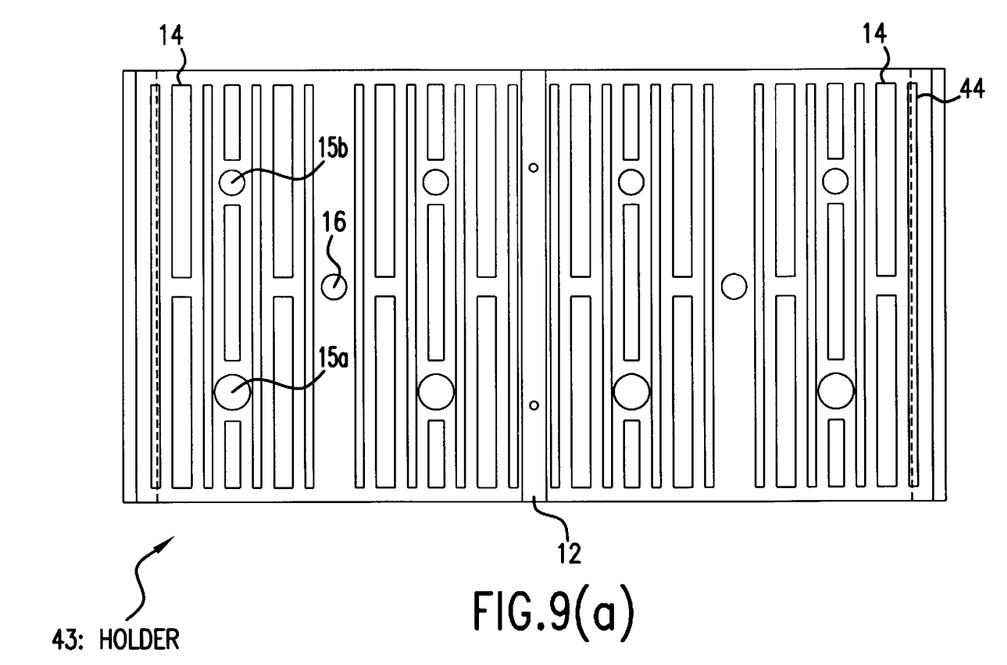
FIG. 9 shows the constitution of a holder according to a second embodiment of the present invention.
Figure 9B:
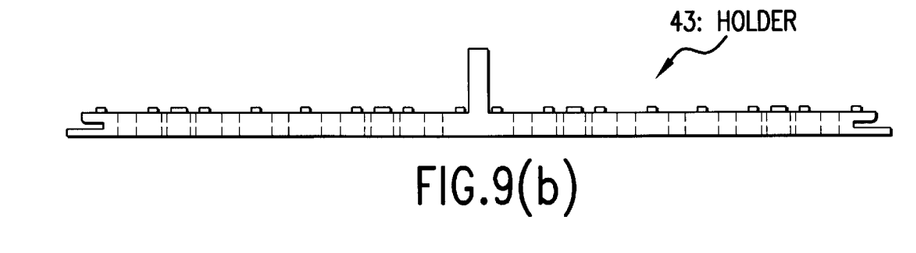

FIG. 9(a) is a plan view from the back surface side of a holder 43 which is used in a second embodiment of the present invention. FIG. 9(b) is a side view of the holder 43.

This embodiment is characterized in that a radiation member 44 is provided on a back surface side of the holder 43, which is a panel fixture. More specifically, heat radiated from the flat display panels 1 is conducted to the holder 43 on which the flat display panels 1 are fixed. By fitting the radiation member 44 to the holder 43, the surface area of the holder 43 is increased, thereby improving radiation of heat. As a result, the radiative cooling effect is enhanced.

In this embodiment, a prismatic radiation member 44 is arranged at a position on the back surface of the holder 43 where holes 14, 15, and 16 are not provided. Particularly, in order to let air from the fan smoothly go through, the longitudinal section of the radiation member 44 is arranged along a vertical direction of the screen. When the unit is assembled, a flexible substrate is fitted to lead pins of the flat display panel 1 which penetrate the holes 14 and 15. Therefore, the height of the radiation member 44 must be such that it will not be an obstacle to installation of the flexible substrate. Thus, the cooling effect of the flat display panels can be further improved by using a holder 43 on which the radiation member 44 is arranged.

As described above, in this embodiment, the radiation member 44 comprising a radiation mechanism is fitted to the holder 43 so as to enhance radiation. Further, in this embodiment, the holder 43 is preferably molded using a magnesium alloy so as to further enhance the radiation effect. Aluminum which is generally cheap, light, and rigid is often used for holders, but magnesium alloy is more rigid, radiative, and lighter than aluminum. Further, as it is easy to cast a magnesium alloy holder in a mold, a magnesium alloy frame is also preferable.

In this embodiment, as shown in FIG. 9, the prismatic radiation members are provided between each of the holes 14, 15, and 16 along a longitudinal direction of the screen. However, it may also be preferable to employ a constitution in which several thin plate type fins are installed in a standing position between each of the holes 14, 15, and 16 to secure a larger surface area and thereby further enhance radiation. Thus, a configuration of the radiation member and orientation and location of the radiation member on a back surface of the holder 43 may be determined in consideration of quantity of heat produced by the flat display panels 1, size of the display screen 50, the environment where the display screen 50 is installed, production costs of the holder 43, or similar factors.

What is claimed is:

1. A method for manufacturing a large area display screen, comprising the steps of:

aligning a plurality of flat display panels, each of which can be independently driven to display an image on a display surface by applying voltages to electrode pins installed in a back surface of said panel, and fixing said aligned flat display panels on a panel holder to form a display screen in an arrangement wherein a clearance is maintained between said panels sufficient to permit air to circulate between said panels; and attaching a circuit substrate to the electrode pins of said fixed flat display panels through openings in said panel holder through which said electrode pins project, said circuit substrate electrically connecting said plurality of flat display panels to external driving circuitry.

2. The screen manufacturing method according to claim 6, wherein, when a module is formed by connecting said plurality of flat display panels and a display screen is manufactured by lining up modules, said modules being arranged leave a small clearance sufficient to permit air to circulatie between said modules.

3. A large area display screen, comprising:

a plurality of flat display panels, each of which can be independently driven to display an image on a display surface by applying voltages to electrode pins installed in a back surface of said panel, fixed on a panel holder to form a display screen;

a heat radiation member fixed to a surface of said panel holder opposite said plurality of flat display panels; and a circuit substrate attached to the electrode pins of said fixed flat display panels through openings in said panel holder through which said electrode pins project, said circuit substrate electrically connecting said plurality of flat display panels to external driving circuitry.

4. The flat display panel screen according to claim 7, wherein said radiation member is a fin.

5. The flat display panel screen according to claim 7, wherein said panel is molded magnesium alloy.

* * * * *

UNITED STATES PATENT AND TRADEMARK OFFICE
CERTIFICATE OF CORRECTION

PATENT NO. : 6,077,140
DATED : June 20, 2000
INVENTOR(S) : Kazuo Kimura, Kazuhisa Hemmi, Kazumasa Ogura It is certified that error appears in the above-identified patent and that said Letters Patent is hereby corrected as shown below:

Title page,
Under "References Cited", insert -- FOREIGN PATENT DOCUMENTS

| | | |
|---|---|---|
| 2121782 | 10/90 | Japan |
| 7212689 | 08/95 | Japan |
| 7210095 | 08/95 | Japan |
| 4194975 | 07/92 | Japan |
| 855567 | 02/96 | Japan |
| 5121005 | 05/93 | Japan |
| 8179836 | 07/96 | Japan |
| 1135481 | 09/89 | Japan |
| 9844531 | 10/98 | International (WO) --. |

Column 4,
Line 19, after "deviation" delete "in".

Column 8, claim 2,
Line 19, change "6" to -- 1 --.
Line 23, after "arranged" insert -- to --.

Column 8, claim 4,
Line 38, change "7" to -- 3 --.

Column 8, claim 5,
Line 40, change "7" to -- 3 --.

UNITED STATES PATENT AND TRADEMARK OFFICE
CERTIFICATE OF CORRECTION

PATENT NO. : 6,077,140
DATED : June 20, 2000
INVENTOR(S) : Kazuo Kimura, Kazuhisa Hemmi, Kazumasa Ogura It is certified that error appears in the above-identified patent and that said Letters Patent is hereby corrected as shown below:

<u>Column 6,</u>
Line 14, change "nodules" to -- modules --.
Line 29, change "panel I" to -- panel 1 --.

Signed and Sealed this

Thirteenth Day of November, 2001

Attest:

NICHOLAS P. GODICI
*Attesting Officer*  *Acting Director of the United States Patent and Trademark Office*